United States Patent
Uchikura et al.

(10) Patent No.: US 6,935,928 B2
(45) Date of Patent: Aug. 30, 2005

(54) CHEMICAL MECHANICAL POLISHING AQUEOUS DISPERSION AND CHEMICAL MECHANICAL POLISHING METHOD

(75) Inventors: Kazuhito Uchikura, Chuo-ku (JP);
Kazuo Nishimoto, Chuo-ku (JP);
Masayuki Hattori, Chuo-ku (JP);
Nobuo Kawahashi, Chuo-ku (JP);
Hiroyuki Yano, Yokohama (JP);
Yukiteru Matsui, Yokohama (JP);
Gaku Minamihaba, Yokohama (JP);
Dai Fukushima, Kamakura (JP);
Nobuyuki Kurashima, Yokohama (JP)

(73) Assignees: JSR Corporation, Tokyo (JP);
Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/882,362

(22) Filed: Jul. 2, 2004

(65) Prior Publication Data

US 2005/0037693 A1 Feb. 17, 2005

(30) Foreign Application Priority Data

Jul. 4, 2003 (JP) .......................................... 2003-191766

(51) Int. Cl.[7] ...................... H01L 21/302; H01L 21/461
(52) U.S. Cl. .......................................... 451/36; 438/692
(58) Field of Search ............................... 451/36, 37, 41, 451/60; 438/690, 691, 692, 693; 51/307; 252/79.1, 79.4; 156/345.11, 345.12

(56) References Cited

U.S. PATENT DOCUMENTS

| | | | |
|---|---|---|---|
| 6,579,153 B2 | | 6/2003 | Uchikura et al. |
| 2003/0153183 A1 | * | 8/2003 | Konno et al. ............... 438/689 |
| 2004/0067649 A1 | * | 4/2004 | Hellring et al. ............. 438/689 |
| 2004/0162011 A1 | * | 8/2004 | Konno et al. ................. 451/41 |

FOREIGN PATENT DOCUMENTS

| | | |
|---|---|---|
| JP | 2001-196336 | 7/2001 |
| JP | 2002-110597 | 4/2002 |
| JP | 2002-151451 | 5/2002 |

* cited by examiner

Primary Examiner—Jacob K. Ackun, Jr.
(74) Attorney, Agent, or Firm—Oblon, Spivak, McClelland, Maier & Neustadt, P.C.

(57) ABSTRACT

A chemical mechanical polishing aqueous dispersion comprises a component (A) composed of abrasive grains, a component (B) composed of at least one of quinolinecarboxylic acid and pyridinecarboxylic acid, a component (C) composed of an organic acid other than quinolinecarboxylic acid and pyridinecarboxylic acid and a component (D) composed of an oxidizing agent, wherein a mass ratio (WB/WC) of the content (WB) of the component (B) to the content (WC) of the component (C) is not less than 0.01 and less than 2, and the concentration of an ammonia component composed of ammonia and ammonium ion is not more than 0.005 mol/litter. According to the chemical mechanical polishing aqueous dispersion, various layers to be processed can be polished with high efficiency, and a sufficiently planarized polished surface of high precision can be obtained.

20 Claims, 2 Drawing Sheets (a)

(b)

(c)

(a)

(b)

(c)

CHEMICAL MECHANICAL POLISHING AQUEOUS DISPERSION AND CHEMICAL MECHANICAL POLISHING METHOD

FIELD OF THE INVENTION

The present invention relates to a chemical mechanical polishing aqueous dispersion and a chemical mechanical polishing method, which are used in a process for producing semiconductor devices. More particularly, the invention relates to a chemical mechanical polishing aqueous dispersion capable of highly efficiently polishing various layers to be processed, said various layers being provided on a semiconductor substrate, and capable of providing a sufficiently planarized polished surface of high precision, and a chemical mechanical polishing method using the dispersion.

BACKGROUND OF THE INVENTION

As the recent technique used in the process for producing semiconductor devices, wiring forming technique using Damascene method is known. In this method, a barrier metal layer comprising a hard metal or the like is formed on an insulating layer which is obtained by forming a depression for wiring such as a hole or a trench in an insulating film provided on a process wafer, then a wiring material such as tungsten, aluminum or copper is accumulated in the depression for wiring to form a wiring material layer, and thereafter the wiring material layer and barrier metal layer which have been formed on a region other than the depression for wiring are removed by chemical mechanical polishing to expose the surface of the insulating layer in said region and to leave the barrier metal and the wiring material in only the depression for wiring, whereby wiring called Damascene wiring is formed.

In the process for forming the Damascene wiring, there are the following problems attributable to the chemical mechanical polishing. Because relatively soft metals which are preferably used as wiring materials, such as copper, are polished easily, the wiring material layer is excessively polished especially when a width of wiring to be formed is large. Therefore, formation of a concave portion, i.e., so-called dishing, is caused at the center of the resulting wiring, and a flat polished surface cannot be obtained in some cases. Moreover, occurrence of scratches may cause disconnection of wiring.

Further, it is not easy to efficiently polish the barrier metal layer comprising a metal of high hardness such as tantalum.

Furthermore, in the case where a porous substance having a small dielectric constant is used for an insulating film to constitute an insulating layer, if a chemical mechanical aqueous dispersion having low pH is used as a processing liquid for the chemical mechanical polishing, a satisfactory polishing rate is not obtained. On the other hand, if a chemical mechanical aqueous dispersion having high pH is used, the insulating layer is sometimes polished excessively. Moreover, even if any of these chemical mechanical polishing aqueous dispersions is used, it is not easy to inhibit occurrence of scratches.

Accordingly, as a chemical mechanical polishing method for forming Damascene wiring, a method of performing multi-step chemical mechanical polishing on a polishing-intended surface is usually used. In general, there has been widely adopted a two-step polishing method wherein two-step polishing consisting of a first polishing step to mainly polish a wiring material layer comprising a wiring material such as copper and a second polishing step to mainly polish a barrier metal layer is performed.

As the two-step polishing method, there has been proposed, for example, a method wherein in the first polishing step a removal-intended wiring material layer portion of the copper layer that is a wiring material layer is completely removed and in the second polishing step a removal-intended barrier metal layer portion is completely removed (this method being also referred to as a "first method" hereinafter). In this first method, however, there is a problem that it is difficult to correct, in the second polishing step, dishing that has been not a little caused in the first polishing step, and hence favorable Damascene wiring cannot be formed.

Further, there has been proposed a method wherein in the first polishing step a removal-intended wiring material layer portion of the wiring material layer is removed except a part of said portion so that dishing should not be caused and in the second polishing step, while the remainder of the removal-intended wiring material layer portion is completely removed, a removal-intended barrier metal layer portion is completely removed (this method being also referred to as a "second method" hereinafter).

As processing liquids employable in the above-described two-step polishing methods, various chemical mechanical polishing aqueous dispersions have been proposed.

The chemical mechanical polishing aqueous dispersion for use in the second polishing step of the second method needs to have not only a function of removing copper that is a wiring material and a barrier metal at the same time by the chemical mechanical polishing but also a function of polishing a surface of an insulating layer. Therefore, there has been proposed a chemical mechanical polishing aqueous dispersion having polishing properties that when each of a copper film, a barrier metal film and an insulating film is chemically mechanically polished under the same conditions using said dispersion, both removal rate ratios ($R_{BM}/R_{Cu}$) and ($R_{In}/R_{Cu}$) approximate to 1, wherein the $R_{BM}/R_{Cu}$ is ratio of a barrier metal film removal rate ($R_{BM}$) to a copper film removal rate ($R_{Cu}$) and the $R_{In}/R_{Cu}$ is ratio of an insulating film removal rate ($R_{In}$) to a copper film removal rate ($R_{Cu}$) (see, for example, Japanese Patent Laid-Open Publication No. 196336/2001).

In the Japanese Patent Laid-Open Publication No. 196336/2001, a chemical mechanical polishing aqueous dispersion containing an abrasive, an oxidizing agent and a specific removal rate-adjusting agent is disclosed, and in the working examples, a chemical mechanical polishing aqueous dispersion containing a polishing rate-adjusting agent consisting of potassium maleate and having a removal rate ratio ($R_{BM}/R_{Cu}$) of 0.66 to 1.11 and a removal rate ratio ($R_{In}/R_{Cu}$) of 0.72 to 1.42 is prepared, and two-step polishing using this chemical mechanical polishing aqueous dispersion in the second polishing step is carried out.

In recent years, however, polishing performance of a chemical mechanical polishing aqueous dispersion used in the first polishing step of the second method has been relatively enhanced, and consequently, the wiring material layer portion remaining after the first polishing step tends to become smaller than before. In the second polishing step, therefore, it is necessary to increase the proportion of the polished amount of the barrier metal layer as compared with the wiring material layer and the insulating layer. However, the chemical mechanical polishing aqueous dispersion described in the Japanese Patent Laid-Open Publication No. 196336/2001 has a removal rate ratio ($R_{BM}/R_{Cu}$) of approximate 1, so that copper that is a wiring material is sometimes polished excessively, and a highly precisely flat polished surface cannot be obtained occasionally.

Accordingly, as a chemical mechanical polishing aqueous dispersion for use in the second polishing step, a chemical mechanical polishing aqueous dispersion having polishing properties suitable for the above circumstances, that is, polishing properties that the removal rate ratio ($R_{BM}/R_{Cu}$) is moderately large and the removal rate ratio ($R_{In}/R_{Cu}$) approximates to 1 is desired.

In Japanese Patent Laid-Open Publication No. 151451/2002, an aqueous dispersion having a removal rate ratio ($R_{BM}/R_{Cu}$) of 0.5 to 200 is disclosed as a chemical mechanical polishing aqueous dispersion used in the second polishing step of the two-step polishing method. The polishing rate ratio ($R_{BM}/R_{Cu}$) of this aqueous dispersion is adjusted by using benzotriazole as a polishing rate-adjusting agent and controlling its concentration. In this case, however, the removal rate ratio ($R_{In}/R_{Cu}$) also varies largely, so that if the removal rate ratio ($R_{In}/R_{Cu}$) is set in the vicinity of 1, the removal rate ratio ($R_{BM}/R_{Cu}$) is markedly increased, and if the removal rate ratio ($R_{BM}/R_{Cu}$) is relatively decreased, the removal rate ratio ($R_{In}/R_{Cu}$) is markedly decreased.

Thus, a chemical mechanical polishing aqueous dispersion having the polishing properties that the removal rate ratio ($R_{BM}/R_{Cu}$) is moderately large and the removal rate ratio ($R_{In}/R_{Cu}$) approximates to 1 has not been proposed yet.

Recently, also in the first method, polishing performance of the chemical mechanical polishing aqueous dispersion for use in the first polishing step has been enhanced and inhibition of occurrence of dishing has become possible, so that the first method has been reconsidered as a method for forming Damascene wiring. Also as the chemical mechanical polishing aqueous dispersion for use in the second polishing step of the first method, an aqueous dispersion having polishing properties that the barrier metal layer removal rate is relatively large as described above has been desired.

In Japanese Patent Laid-Open Publication No. 110597/2002, a chemical mechanical aqueous dispersion containing, as removal rate-adjusting agents, quinolinecarboxylic acid and another organic acid in combination is disclosed, and in the working examples, a chemical mechanical polishing aqueous dispersion containing oxalic acid or malonic acid as another organic acid and having a mass ratio (WB/WC) of the content (WB) of quinolinecarboxylic acid to the content (WC) of another organic acid being 1.25 to 5 is specifically disclosed. The invention of the Japanese Patent Laid-Open Publication No. 110597/2002, however, is intended to enhance the removal rate of the wiring material, particularly copper, and this publication neither describes a removal rate ratio ($R_{BM}/R_{Cu}$) and a removal rate ratio ($R_{In}/R_{Cu}$) nor suggests two-step polishing.

OBJECT OF THE INVENTION

The present invention is intended to solve such problems associated with the prior art as described above, and it is an object of the present invention to provide a chemical mechanical polishing aqueous dispersion capable of highly efficiently polishing various layers to be processed and capable of providing a sufficiently planarized polished surface of high precision, and a chemical mechanical polishing method using the dispersion.

SUMMARY OF THE INVENTION

The present inventor has earnestly studied to solve the above problems, and as a result, he has found that the use of at least one of quinolinecarboxylic acid and pyridinecarboxylic acid and another organic acid in combination and by using these acids in a specific mass ratio provides a chemical mechanical polishing aqueous dispersion having polishing properties that when a copper film, a barrier metal film and an insulating film are chemically mechanically polished under the same conditions using said dispersion, their removal rate ratios become specific values. The present inventor has also found that by the use of this chemical mechanical polishing aqueous dispersion, a sufficiently planarized polished surface of high precision is obtained. The present invention has been accomplished based on the finding.

That is to say, the chemical mechanical polishing aqueous dispersion according to the present invention is a chemical mechanical polishing aqueous dispersion comprising a component (A) composed of abrasive grains, a component (B) composed of at least one of quinolinecarboxylic acid and pyridinecarboxylic acid, a component (C) composed of an organic acid other than quinolinecarboxylic acid and pyridinecarboxylic acid and a component (D) composed of an oxidizing agent, wherein:

a mass ratio (WB/WC) of the content (WB) of the component (B) to the content (WC) of the component (C) is not less than 0.01 and less than 2, and a concentration of an ammonia component composed of ammonia and ammonium ion is not more than 0.005 mol/liter.

The chemical mechanical polishing aqueous dispersion preferably has properties that when each of a copper film, a barrier metal film and an insulating film is chemically mechanically polished under the same conditions using said dispersion, a removal rate ratio ($R_{BM}/R_{Cu}$) of a barrier metal film removal rate ($R_{BM}$) to a copper film removal rate ($R_{Cu}$) is not less than 1.2, and a removal rate ratio ($R_{In}/R_{Cu}$) of an insulating film removal rate ($R_{In}$) to a copper film removal rate ($R_{Cu}$) is 0.5 to 2.

The organic acid to constitute the component (C) preferably comprises an organic acid of 4 or more carbon atoms. The oxidizing agent to constitute the component (D) preferably comprises hydrogen peroxide. The chemical mechanical polishing aqueous dispersion preferably has pH of 8 to 13.

The chemical mechanical polishing method according to the present invention is a method for chemically mechanically polishing a target to be polished, through two-step polishing, wherein said target has at least an insulating film with a trench, a barrier metal film and a copper film laminated in this order on a surface of a substrate, said method comprising:

a first polishing step of chemically mechanically polishing a removal-intended portion of the copper film of the target to be polished to remove said portion until the barrier metal film is exposed, by the use of a chemical mechanical polishing aqueous dispersion having properties that when each of a copper film and a barrier metal film is chemically mechanically polished under the same conditions using said dispersion, a removal rate ratio ($R_{Cu}/R_{BM}$) of a copper film removal rate ($R_{Cu}$) to a barrier metal film removal rate ($R_{BM}$) is not less than 50, and a second polishing step of chemically mechanically polishing a polishing-intended surface, which has been chemically mechanically polished in the first polishing step, to remove a removal-intended portion of the barrier metal film of the target to be polished, by the use of a chemical mechanical polishing aqueous dispersion having properties that when each of a copper film, a barrier metal film and an insulating film is chemically mechanically polished under the same conditions using said dispersion, a removal rate ratio ($R_{BM}/R_{Cu}$) of a barrier metal film removal rate ($R_{BM}$) to a copper film removal rate ($R_{Cu}$) is not less than 1.2, and a removal rate ratio ($R_{In}/R_{Cu}$) of an insulating film removal rate ($R_{In}$) to a copper film removal rate ($R_{Cu}$) is 0.5 to 2;

wherein the aqueous dispersion used in the second polishing step comprises a component (A) composed of abrasive grains, a component (B) composed of at least one of quinolinecarboxylic acid and pyridinecarboxylic acid, a component (C) composed of an organic acid other than quinolinecarboxylic acid and pyridinecarboxylic acid and a component (D) composed of an oxidizing agent, and a mass ratio (WB/WC) of the content (WB) of the component (B) to the content (WC) of the component (C) is not less than 0.01 and less than 2.

In the chemical mechanical polishing method according to the present invention, the concentration of an ammonia component composed of ammonia and ammonium ion in the chemical mechanical polishing aqueous dispersion used in the second polishing step is preferably not more than 0.005 mol/liter.

The organic acid to constitute the component (C) preferably comprises an organic acid of 4 or more carbon atoms.

The concentration of the oxidizing agent to constitute the component (D) contained in the chemical mechanical polishing aqueous dispersion used in the second polishing step is preferably 0.001 to 2% by mass. The oxidizing agent to constitute the component (D) preferably comprises hydrogen peroxide.

The chemical mechanical polishing aqueous dispersion used in the second polishing step preferably contains the abrasive grains to constitute the component (A) in an amount of more than 1 part by mass and not more than 10 parts by mass based on 100 parts by mass of the aqueous dispersion.

The chemical mechanical polishing aqueous dispersion used in the first polishing step preferably comprises abrasive grains, an organic acid and an oxidizing agent, said aqueous dispersion containing at least one ammonia component selected from the group consisting of ammonia and an ammonium ion. The oxidizing agent contained in the chemical mechanical polishing aqueous dispersion used in the first polishing step preferably comprises ammonium persulfate.

The chemical mechanical polishing kit according to the present invention comprises a combination of chemical mechanical polishing aqueous dispersion (I) and (II), wherein the aqueous dispersion (I) does not mixed with the aqueous dispersion (II);

the aqueous dispersion (I) comprises abrasive grains, an organic acid and an oxidizing agent, said aqueous dispersion (I) comprising at least one ammonia component selected from the group consisting of ammonia and an ammonium ion, and has properties that when each of a copper film and a barrier metal film is chemically mechanically polished under the same conditions using said dispersion, a removal rate ratio ($R_{Cu}/R_{BM}$) of a copper film removal rate ($R_{Cu}$) to a barrier metal film removal rate ($R_{BM}$) is not less than 50; and the aqueous dispersion (II) comprises a component (A) composed of abrasive grains, a component (B) composed of at least one of quinolinecarboxylic acid and pyridinecarboxylic acid, a component (C) composed of an organic acid other than quinolinecarboxylic acid and pyridinecarboxylic acid and a component (D) composed of an oxidizing agent, a mass ratio (WB/WC) of the content (WB) of said component (B) to the content (WC) of said component (C) being not less than 0.01 and less than 2, and has properties that when each of a copper film, a barrier metal film and an insulating film is chemically mechanically polished under the same conditions using said dispersion, a removal rate ratio ($R_{BM}/R_{Cu}$) of a barrier metal film removal rate ($R_{BM}$) to a copper film removal rate ($R_{Cu}$) is not less than 1.2, and a removal rate ratio ($R_{In}/R_{Cu}$) of an insulating film removal rate ($R_{In}$) to a copper film removal rate ($R_{Cu}$) is 0.5 to 2.

The concentration of an ammonia component composed of ammonia and ammonium ion in the chemical mechanical polishing aqueous dispersion (II) is preferably not more than 0.005 mol/liter.

The organic acid to constitute the component (C) preferably comprises an organic acid of 4 or more carbon atoms.

The concentration of the oxidizing agent to constitute the component (D) contained in the chemical mechanical polishing aqueous dispersion (II) is preferably 0.001 to 2% by mass. The oxidizing agent to constitute the component (D) preferably comprises hydrogen peroxide.

The chemical mechanical polishing aqueous dispersion (II) preferably contains the abrasive grains to constitute the component (A) in an amount of more than 1 part by mass and not more than 10 parts by mass based on 100 parts by mass of the aqueous dispersion (II).

The oxidizing agent contained in the chemical mechanical polishing aqueous dispersion (I) preferably comprises ammonium persulfate.

EFFECT OF THE INVENTION

By performing chemical mechanical polishing using the chemical mechanical polishing aqueous dispersion of the invention, various layers to be processed can be polished with high efficiency, and a sufficiently planarized polished surface of high precision can be obtained.

According to the chemical mechanical polishing method of the invention, a chemical mechanical polishing aqueous dispersion having specific polishing properties is used in the first polishing step and the chemical mechanical polishing aqueous dispersion of the invention is used in the second polishing step. On this account, various layers to be processed can be polished with high efficiency, and a sufficiently planarized polished surface of high precision can be obtained. As a result, excellent Damascene copper wiring can be formed in the production process of semiconductor devices.

BRIEF DESCRIPTION OF THE DRAWINGS

FIG. 1(a) is a sectional view of an example of a target to be polished,

FIG. 1(b) is a sectional view of a target given after the first polishing step with respect to the target shown in FIG. 1(a), and FIG. 1(c) is a sectional view of Damascene wiring after the second polishing step, said Damascene wiring being formed by the chemical mechanical polishing method according to the present invention.

FIG. 2(a) is a sectional view of an example of a target to be polished,

FIG. 2(b) is a sectional view of a target given after the first polishing step with respect to the target shown in FIG. 2(a), and FIG. 2(c) is a sectional view of Damascene wiring after the second polishing step, said Damascene wiring being formed by the chemical mechanical polishing method according to the present invention.

Figure 1:
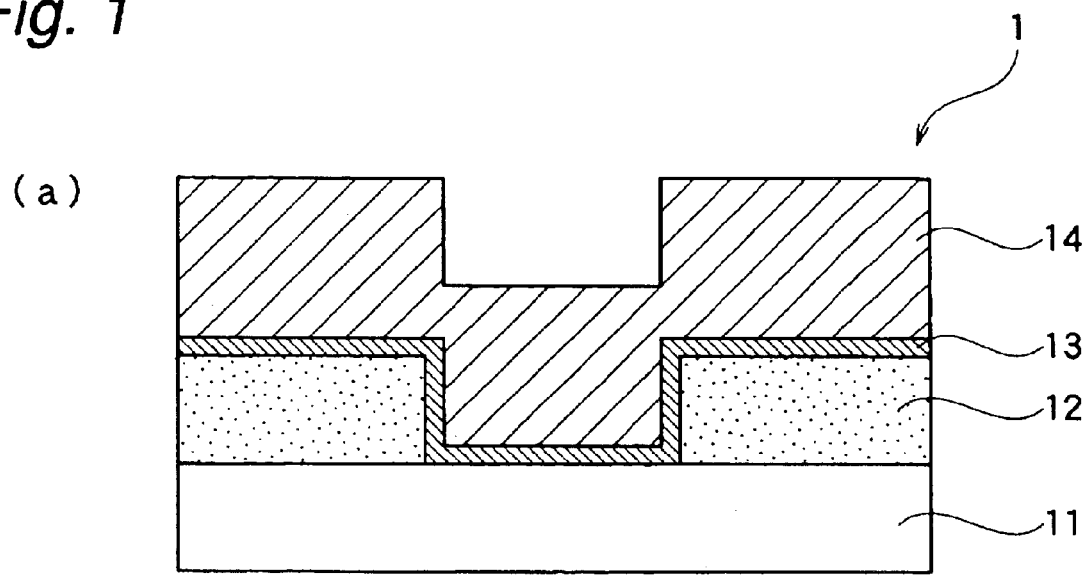
FIG. 1 is a group of schematic views showing an embodiment of the chemical mechanical polishing method according to the present invention.
Figure 1:
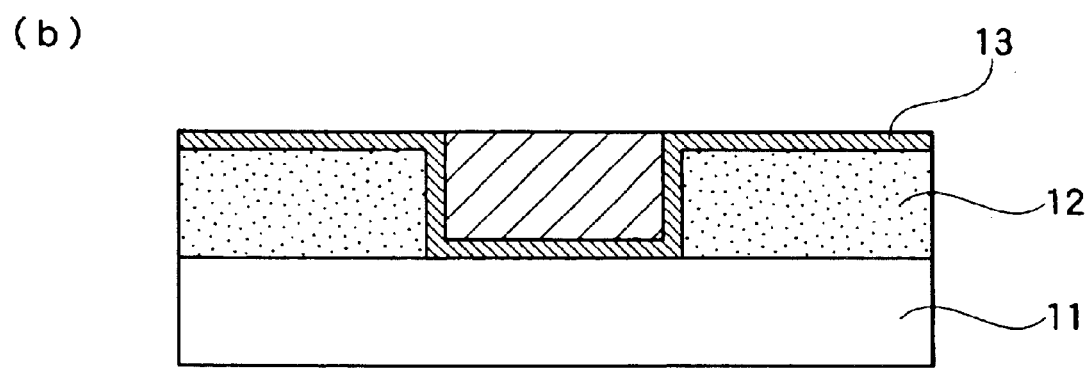
Figure 1:
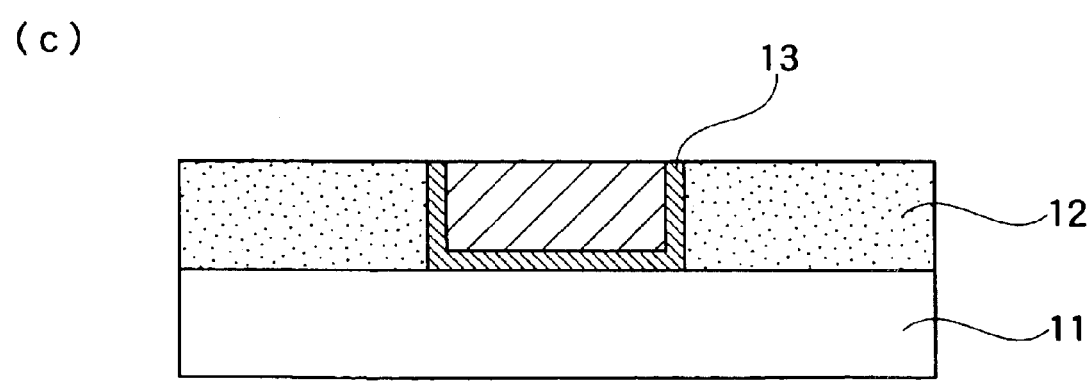
Figure 2:
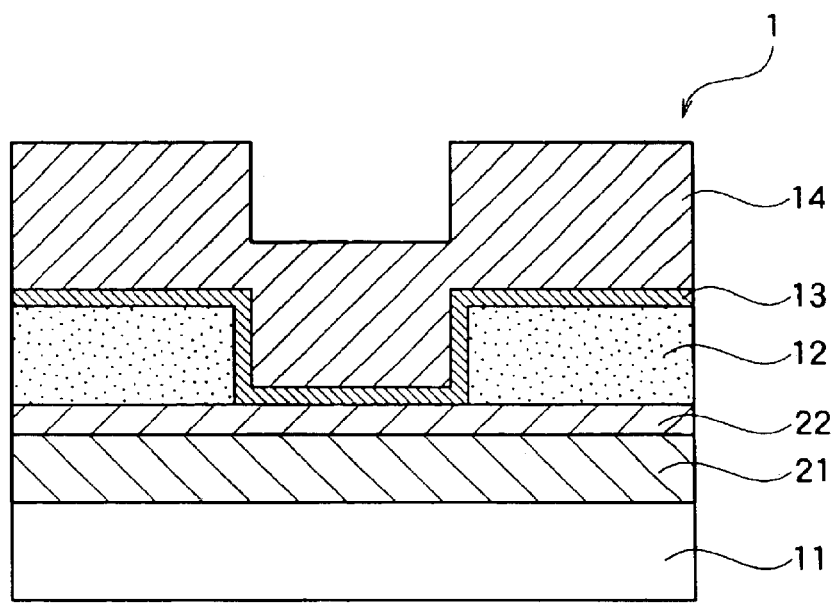
FIG. 2 is a group of schematic views showing an embodiment of the chemical mechanical polishing method according to the present invention.
Figure 2:
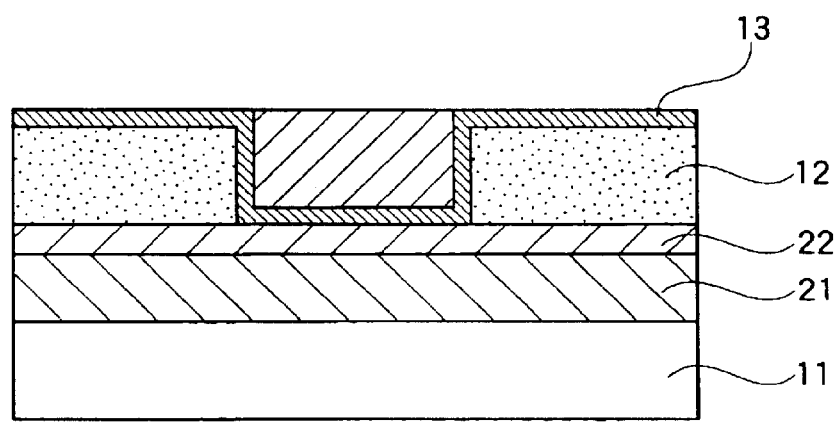
Figure 2:
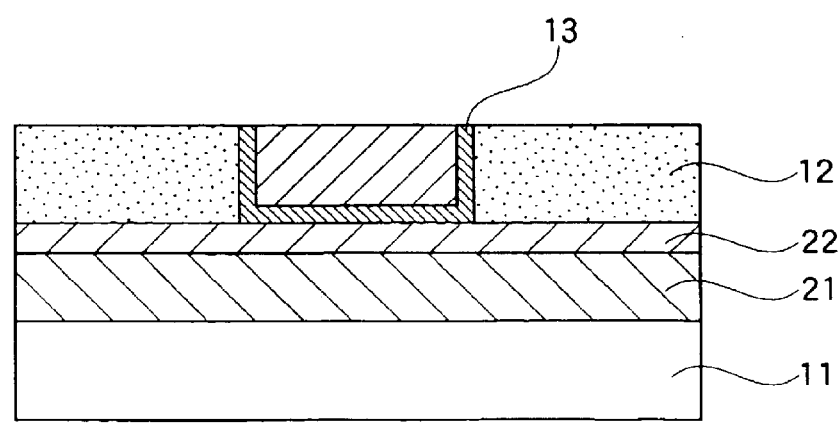

Here are Symbols in FIGS. 1 and 2.

1: composite substrate material
11: substrate (made of, for example, silicon)
12: insulating film (made of, for example, PETEOS)
13: barrier metal film
14: metal film
21: insulating film (made of, for example, silicon oxide)
22: insulating film (made of, for example, silicon nitride)

PREFERRED EMBODIMENTS OF THE INVENTION

Chemical Mechanical Polishing Aqueous Dispersion

The chemical mechanical polishing aqueous dispersion of the invention (also referred to as a "polishing aqueous dispersion" hereinafter) is a processing liquid used in the chemical mechanical polishing process, and comprises a component (A) composed of abrasive grains, a component (B) composed of at least one of quinolinecarboxylic acid and pyridinecarboxylic acid, a component (C) composed of an organic acid other than quinolinecarboxylic acid and pyridinecarboxylic acid and a component (D) composed of an oxidizing agent.

The chemical mechanical polishing aqueous dispersion preferably has polishing properties that when each of a copper film, a barrier metal film and an insulating film is chemically mechanically polished under the same conditions using said dispersion, a removal rate ratio ($R_{BM}/R_{Cu}$) of a barrier metal film removal rate ($R_{BM}$) to a copper film removal rate ($R_{Cu}$) is not less than 1.2, and a removal rate ratio ($R_{In}/R_{Cu}$) of an insulating film removal rate ($R_{In}$) to a copper film removal rate ($R_{Cu}$) is 0.5 to 2.

In the present invention, the "copper film" is not limited to a film consisting of pure copper, and also includes, for example, a film comprising an alloy having a copper content of not less than 95% by mass, such as a copper-silicon alloy or a copper-aluminum alloy.

The "barrier metal film" includes a film comprising a metal such as tantalum or titanium and a film comprising a nitride or an oxide of such metal. The metal to constitute the barrier metal film is not limited to a pure metal such as pure tantalum or pure titanium, and also includes, for example, an alloy such as a tantalum-niobium. Examples of the metal nitrides to constitute the barrier metal film include tantalum nitride and titanium nitride, but the metal nitride is not limited to a pure metal nitride.

In the present invention, of the above metals, the barrier metal film preferably comprises at least one of tantalum and tantalum nitride.

The "insulating film" is, for example, a silicon oxide ($SiO_2$) film, a boron phosphorus silicate film (BPSG film) obtained by incorporating small amounts of boron and phosphorus into a silicon oxide film, a film called "FSG (fluorine doped silicate glass)" which is obtained by doping a silicon oxide film with fluorine (also referred to as a "FSG film" hereinafter), or a low dielectric constant film.

The silicon oxide film is, for example, a thermal oxidation film, a PETEOS film (plasma enhanced-TEOS film), a HDP film (high density plasma enhanced-TEOS film), or a film obtained by a thermal CVD process (also referred to as a "thermal CVD processed film" hereinafter).

The thermal oxidation film can be formed by heating silicon to a high temperature and exposing silicon to an oxidizing atmosphere to chemically react silicon with oxygen or by chemically reacting silicon with water.

The PETEOS film can be formed by chemical vapor deposition using tetraethyl orthosilicate (TEOS) as a raw material and applying plasma as acceleration conditions.

The HDP film can be formed by chemical vapor deposition using tetraethyl orthosilicate (TEOS) as a raw material and applying high-density plasma as acceleration conditions.

The thermal CVD processed film can be formed by an atmospheric pressure CVD process (AP-CVD process) or a low pressure CVD process (LP-CVD process).

The boron phosphorus silicate film (BPSG film) can be formed by an atmospheric pressure CVD process (AP-CVD process) or a low pressure CVD process (LP-CVD process).

The FSG film can be formed by chemical vapor deposition applying high-density plasma as acceleration conditions.

Of the low dielectric constant films, a silicon oxide-based film is, for example, a HSQ film (hydrogen silsesquioxane film) using triethoxysilane as a raw material or a MSQ film (methyl silsesquioxane film) using tetraethoxysilane and a small amount of methyltrimethoxysilane as raw materials. The low dielectric constant film based on silicon oxide can be formed by, for example, coating a substrate with a raw material by spin-coating and heating the coating film in an oxidizing atmosphere.

Examples of the low dielectric constant films other than the silicon oxide-based film include films using organic polymers, such as a polyarylene polymer, a polyarylene ether polymer, a polyimide polymer and a benzocyclobutene polymer, as raw materials.

In the present invention, the term "same conditions" means that a polishing apparatus of specific type is used and particular conditions to measure the removal rate are the same with respect to each of rotating speeds of a turn table and a head, polishing pressure, polishing time, type of a polishing pad used, and feed quantity of the polishing aqueous dispersion per unit time (feed rate of polishing aqueous dispersion).

These removal rate measuring conditions can be appropriately determined as far as the removal rate of each of the copper film, the barrier metal film and the insulating film can be measured under the same conditions, but the conditions are preferably those the same as or near the conditions under which chemical mechanical polishing of the polishing-intended surface is actually carried out.

More specifically, the following conditions are adoptable as the removal rate measuring conditions. The rotating speed of a turn table is a fixed value within the range of usually 30 to 120 rpm, preferably 40 to 100 rpm. The rotating speed of a head is a fixed value within the range of usually 30 to 120 rpm, preferably 40 to 100 rpm. A ratio of the turn table rotating speed to the head rotating speed is a fixed value within the range of usually 0.5 to 2, preferably 0.7 to 1.5. The polishing pressure is a fixed value within the range of usually 100 to 500 g/cm$^2$, preferably 200 to 350 g/cm$^2$. The feed rate of the polishing aqueous dispersion is a fixed value within the range of usually 50 to 300 ml/min, preferably 100 to 200 ml/min.

The "removal rate ratio ($R_{BM}/R_{Cu}$)" and the "removal rate ratio ($R_{In}/R_{Cu}$)" are values calculated based on the removal rate of each of the copper film, the barrier metal film and the insulating film, said removal rate being determined by chemically mechanically polishing those films separately under the same conditions. The chemical mechanical polishing for the calculation of the polishing rate ratios is carried out with respect to, as an independent target to be polished, each of the copper film, the barrier metal film and the insulating film formed on wafer surfaces with no pattern.

The polishing aqueous dispersion of the invention has polishing properties that a removal rate ratio ($R_{BM}/R_{Cu}$) of a barrier metal film removal rate ($R_{BM}$) to a copper film removal rate ($R_{Cu}$) is not less than 1.2, wherein the $R_{BM}$ and the $R_{Cu}$ are measured under the same conditions. This removal rate ratio ($R_{BM}/R_{Cu}$) is preferably 1.2 to 10, more preferably 1.5 to 10, particularly preferably 1.7 to 10, most preferably 2.0 to 10. If a polishing aqueous dispersion having a removal rate ratio ($R_{BM}/R_{Cu}$) of less than the lower limit of the above range is used, there is a fear that a polished surface having excellent surface properties such as flatness is not obtained after the chemical mechanical polishing.

Further, the polishing aqueous dispersion of the invention has polishing properties that a removal rate ratio ($R_{In}/R_{Cu}$) of an insulting film removal rate ($R_{In}$) to a copper film removal rate ($R_{Cu}$) is 0.5 to 2. This removal rate ratio ($R_{In}/R_{Cu}$) is preferably 0.7 to 1.5, more preferably 0.8 to 1.2, particularly preferably 0.9 to 1.1. If a polishing aqueous dispersion having a removal rate ratio ($R_{In}/R_{Cu}$) of more than the upper limit of the above range is used, the insulating film is sometimes polished excessively, and hence, there is a fear that favorable Damascene wiring cannot be formed. On the other hand, if a polishing aqueous dispersion having a removal rate ratio ($R_{In}/R_{Cu}$) of less than the lower limit of the above range is used, the copper film is sometimes polished excessively, and hence, there is a fear that dishing is caused in the copper wiring portion of Damascene copper wiring to be formed, so that a sufficiently planarized polished surface of high precision cannot be obtained.

The polishing aqueous dispersion having polishing properties that the removal rate ratios become specific values preferably has, for example, the following composition.

Examples of the polishing aqueous dispersion of the invention include an aqueous dispersion (also referred to as a "specific aqueous dispersion" hereinafter) comprising a component (A) composed of abrasive grains, a component (B) composed of at least one of quinolinecarboxylic acid and pyridinecarboxylic acid, a component (C) composed of an organic acid other than quinolinecarboxylic acid and pyridinecarboxylic acid and a component (D) composed of an oxidizing agent, wherein a mass ratio (WB/WC) of the content (WB) of the component (B) to the content (WC) of the component (C) is not less than 0.01 and less than 2, and a concentration of an ammonia component composed of ammonia and ammonium ion is not more than 0.005 mol/liter.

Although only water may be used as the aqueous medium, an aqueous mixed medium containing water as a main component, such as a mixed medium of water and methanol, is also employable. It is particularly preferable to use water only as the aqueous medium.

As the abrasive grains to constitute the component (A), at least one kind of abrasive grains selected from inorganic particles, organic particles and composite particles is employable.

The inorganic particles, the organic particles and the composite particles used as the abrasive grains are preferably in the spherical shapes. By the use of spherical particles as the abrasive grains, a satisfactory removal rate can be obtained, and besides, occurrence of scratch and the like can be inhibited. The "spherical shape" does not always need to be a shape near a complete sphere, and includes an almost spherical shape having no sharp angle portion.

Examples of the inorganic particles include silicon dioxide particles, aluminum oxide particles, cerium oxide particles, titanium oxide particles, zirconium oxide particles, silicon carbide particles, silicon nitride particles and manganese dioxide particles. Of these, silicon dioxide particles are preferable.

The silicon dioxide particles are, for example, fumed silica particles synthesized by reacting a compound containing a silicon atom, such as silicon chloride, with oxygen and hydrogen in a gas phase through a fumed process; colloidal silica particles synthesized by hydrolyzing and condensing metal alkoxide through a sol-gel process; or colloidal silica particles synthesized by an inorganic colloid process and freed of impurities by purification.

It is believed that the inorganic particles which are synthesized by a sol-gel process or an inorganic colloid process and are composed of colloidal silica having relatively small particle diameter are often present as secondary particles in the specific aqueous dispersion, said secondary particles being in a state that primary particles are allowed to associate or agglomerate.

The inorganic particles consisting of colloidal silica particles have an average primary particle diameter of preferably 1 to 3,000 nm, more preferably 2 to 1,000 nm. The inorganic particles consisting of colloidal silica particles have an average secondary particle diameter of preferably 5 to 5,000 nm, more preferably 5 to 3,000 nm, particularly preferably 10 to 1,000 nm. If the average secondary particle diameter is less than the lower limit of the above range, there is a fear that a satisfactory removal rate is not obtained. On the other hand, if the average secondary particle diameter exceeds the upper limit of the above range, there is a fear that occurrence of dishing or erosion cannot be inhibited sufficiently, and not only surface defects such as scratches are liable to occur but also the resulting specific aqueous dispersion is liable to have no sufficient stability.

The average primary particle diameter can be determined by measuring a specific surface area and calculating based on the specific surface area, or can be determined by observation using a transmission electron microscope. The average secondary particle diameter can be measured by the use of a laser scattering diffraction measuring machine or the like.

The inorganic particles consisting of fumed silica particles are obtained as secondary particles in their production process and it is difficult to disperse them as primary particles, so that it is believed that they are present as secondary particles in the specific aqueous dispersion. Therefore, with regard to the inorganic particles consisting of fumed silica particles, only the secondary particle diameter is defined.

The inorganic particles consisting of fumed silica particles have an average secondary particle diameter of preferably 10 to 10,000 nm, more preferably 20 to 7,000 nm, particularly preferably 50 to 5,000 nm. When the average secondary particle diameter is in the above range, a specific aqueous dispersion having a high removal rate, capable of sufficiently inhibiting occurrence of dishing or erosion and having high stability can be obtained.

The organic particles are, for example, particles of thermoplastic resins, such as polystyrene; styrene copolymers; (meth)acrylic resin such as polymethyl methacrylate; (meth) acrylic copolymers; polyvinyl chloride; polyacetal; saturated polyester; polyamide; polyimide; polycarbonate; phenoxy resin; and polyolefins and olefin copolymers, such as polyethylene, polypropylene, poly-1-butene and poly-4-methyl-1-pentene.

Also employable as the organic particles are particles of a resin which is obtained by copolymerizing a monomer used for obtaining the above thermoplastic resin with a monomer having two or more polymerizable unsaturated groups, such as divinylbenzene or ethylene glycol dimethacrylate, and have a crosslinked structure.

Of the above particles, preferable are particles comprising polystyrene, a styrene copolymer, a (meth)acrylic resin such as polymethyl methacrylate, a (meth)acrylic copolymer, or a resin obtained by copolymerizing a monomer used for obtaining such a thermoplastic resin and having a crosslinked structure.

The particles of these resins can be prepared by emulsion polymerization, suspension polymerization, emulsion dispersing, pulverization or the like.

It is believed that most of the organic particles are present as independent particles in the specific aqueous dispersion. The organic particles have an average particle diameter of preferably 10 to 5,000 nm, more preferably 15 to 3,000 nm, particularly preferably 20 to 1,000 m. When the average particle diameter of the organic particles is in the above range, a specific aqueous dispersion having a high removal rate, capable of sufficiently inhibiting occurrence of dishing or erosion and having high stability can be obtained.

The composite particles are, for example, inorganic-organic composite particles wherein an organic particle and an inorganic particle are combined integrally, or modified particles wherein a modification substance is bonded to a surface of an organic particle.

The composite particles consisting of the inorganic-organic composite particles are particles formed in such a united body that the organic particle and the inorganic particle should not be easily separated from each other during the chemical mechanical polishing process. The types of the organic particles and the inorganic particles used herein are not particularly restricted, and the constitution of the composite particles is not particularly restricted either.

More specifically, particles wherein an organic particle and an inorganic particle which are different in the sign of zeta-potential are bonded by the electrostatic force in an aqueous medium are employable as the composite particles.

The zeta-potential of the organic particle is frequently a negative potential over the whole pH region or a wide region except a region of low pH. In particular, an organic particle comprising a polymer having a carboxyl group, a sulfonic acid group or the like has a negative zeta-potential more certainly. An organic particle comprising a polymer having an amino group or the like has a positive zeta-potential in a specific pH region. On the other hand, the zeta-potential of the inorganic particle exhibit a high pH dependence, and the inorganic particle has an isoelectric point at which the zeta-potential becomes 0 at the intrinsic pH, so that the sign of the zeta-potential is reversed across that point.

Accordingly, by combining specific organic particles and specific inorganic particles and mixing them in a pH region where the signs of their zeta-potentials become opposite to each other, the organic particles and the inorganic particles are bonded by the electrostatic force and united to give inorganic-organic composite particles.

Even if the organic particles and inorganic particles wherein the signs of their zeta-potentials are the same at the pH during the mixing are combined, the signs of their zeta-potentials can be made opposite by changing pH thereafter, whereby the organic particles and the inorganic particles can be united to give inorganic-organic composite particles.

As the composite particles consisting of modified particles, modified organic particles wherein an appropriate modification substance is bonded to the surfaces of organic particles comprising a polymer are employable. The polymer particles are, for example, particles of polystyrene, polymethyl methacrylate or the like. The polymer particles to which a modification substance is bonded can be obtained by, for example, polycondensing a reactive material for a modification substance, such as alkoxysilane, aluminum alkoxide or titanium alkoxide, in the presence of the polymer particles to form a modification substance on the surfaces of the polymer particles.

In the process for producing the composite particles, when the material for the modification substance is alkoxysilane, modified organic particles wherein polysiloxane is bonded to the surfaces of the polymer particles are obtained. When the material for the modification substance is aluminum alkoxide or titanium alkoxide, modified organic particles wherein an atom of aluminum or titanium is bonded to the surfaces of the polymer particles are obtained. The surfaces of the polymer particles can be treated with a silane coupling agent or the like.

The composite particles may be inorganic-organic composite particles wherein inorganic particles such as silica particles or alumina particles are bonded to the surfaces of organic particles comprising appropriate polymer particles. In this case, the inorganic particles may be bonded to the surfaces of the polymer particles by being physically held by a bonding component such as polysiloxane, or may be bonded chemically by functional groups such as hydroxyl groups present on the surfaces of the polymer particles.

Also employable as the composite particles are inorganic-organic composite particles modified with a modification substance, which are obtained by polycondensation reaction of, for example, alkoxysilane, aluminum alkoxide or titanium alkoxide in the presence of the inorganic-organic composite particles wherein an organic particle and an inorganic particle are united in one body by the electrostatic force.

When the composite particles are inorganic-organic composite particles, these composite particles are often present in any of the following states or in a mixed state thereof according to the particle diameters, the constitution proportions and the like of the organic particles and the inorganic particles to constitute the composite particles. Of the following states, the composite particles are preferably present in the state (1) or (2).

(1) State where an inorganic particle adheres as a shell particle to a surface of a core particle that is an organic particle.

(2) State where an organic particle adheres as a shell particle to a surface of a core particle that is an inorganic particle.

(3) State where an organic particle and an inorganic particle are agglomerated without forming an obvious core/shell structure.

In each of the states (1) to (3), the inorganic particle may be a primary particle or a secondary particle, or both of them may be mingled.

The mass ratio between the content of the inorganic particles and the content of the organic particles to constitute the inorganic-organic composite particles in the above states (1) to (3) are as follows. The content of the inorganic particles is in the range of preferably 1 to 2,000 parts by mass, more preferably 10 to 1,000 parts by mass, based on 100 parts by mass of the organic particles.

The inorganic-organic composite particles in the above states (1) to (3) have an average particle diameter of preferably 20 to 20,000 nm, more preferably 50 to 10,000 nm, particularly preferably 50 to 5,000 nm.

When the mass ratio and the average particle diameter of the inorganic-organic composite particles are in the above ranges, a specific aqueous dispersion having a high removal rate, capable of sufficiently inhibiting occurrence of dishing or erosion and having high stability can be obtained.

The content of the component (A) is in the range of usually more than 1 part by mass and not more than 10 parts by mass, preferably 2 to 8 parts by mass, more preferably 3.5 to 5.5 parts by mass, based on 100 parts by mass of the specific aqueous dispersion. If the content of the component (A) is less than the lower limit of the above range, there is a fear that a satisfactory removal rate is not obtained. On the other hand, if the content of the component (A) exceeds the upper limit of the above range, there is a fear that the cost is increased and the resulting specific aqueous dispersion does not have sufficient stability.

The component (B) comprises at least one of quinolinecarboxylic acid and pyridinecarboxylic acid.

The quinolinecarboxylic acid is, for example, unsubstituted quinolinecarboxylic acid, or substituted quinolinecarboxylic acid wherein one or more hydrogen atoms in a site other than carboxyl groups in quinolinecarboxylic acid are replaced with hydroxyl groups, halogen atoms or the like.

The pyridinecarboxylic acid is, for example, unsubstituted pyridinecarboxylic acid, or substituted pyridinecarboxylic acid wherein one or more hydrogen atoms in a site other than carboxyl groups in pyridinecarboxylic acid are replaced with hydroxyl groups, halogen atoms or the like.

Of the above compounds, unsubstituted quinolinecarboxylic acid and unsubstituted pyridinecarboxylic acid are preferable, and 2-quinolinecarblxylic acid (quinaldinic acid) and 2,3-pyridinedicarboxylic acid (quinolinic acid) are particularly preferable. The quinolinecarboxylic acid and the pyridinecarboxylic acid may be given from a salt thereof, such as a potassium salt or an ammonium salt.

The content of the component (B) is in the range of preferably 0.01 to 10% by mass, more preferably 0.05 to 5% by mass, particularly preferably 0.1 to 3% by mass, based on the whole specific aqueous dispersion. If the content of the component (B) is less than the lower limit of the above range, there is a fear that a satisfactory copper film removal rate is not obtained. On the other hand, if the content of the component (B) exceeds the upper limit of the above range, other components cannot be contained in desired amounts.

The component (C) comprises an organic acid (also referred to as an "other organic acid" hereinafter) other than the quinolinecarboxylic acid and the pyridinecarboxylic acid.

As the other organic acid, any of various organic acids, e.g., monobasic acids, such as monocarboxylic acid, dibasic acids, such as dicarboxylic acid, hydroxy acids and carboxylate acids, is employable. Examples of such organic acids include saturated acids, unsaturated acids and aromatic acids.

Example of the saturated acids include formic acid, acetic acid, butyric acid, oxalic acid, malonic acid, succinic acid, glutaric acid, adipic acid and hydroxy acids. Examples of the hydroxy acids include lactic acid, malic acid, tartaric acid and citric acid.

Examples of the unsaturated acids include maleic acid and fumaric acid.

Examples of the aromatic acids include benzoic acid and phthalic acid.

Of the above organic acids, preferable are organic acids of 4 or more carbon atoms, more preferable are carboxylic acids of 4 or more carbon atoms, still more preferable are aliphatic carboxylic acids of 4 or more carbon atoms, and particularly preferable are aliphatic carboxylic acids of 4 or more carbon atoms and a molecular weight of not less than 105. Moreover, of the aliphatic carboxylic acids of 4 or more carbon atoms and a molecular weight of not less than 105, preferably are carboxylic acids having 2 or more carboxyl groups in one molecule, particularly preferable are dicarboxylic acids, and most preferable are unsaturated dicarboxylic acids The "other organic acid" may be given from a salt thereof, such as a potassium salt or an ammonium salt.

The content of the component (C) is in the range of preferably 0.01 to 10% by mass, more preferably 0.05 to 5% by mass, particularly preferably 0.1 to 3% by mass, based on the whole specific aqueous dispersion. If the content of the component (C) is less than the lower limit of the above range, there is a fear that a satisfactory barrier metal removal rate is not obtained. On the other hand, if the content of the component (C) exceeds the upper limit of the above range, the polished surface is liable to be corroded.

In the specific aqueous dispersion of the invention, the mass ratio (WB/WC) of the content (WB) of the component (B) to the content (WC) of the component (C) is preferably not less than 0.01 and less than 2, more preferably 0.01 to 1.5, still more preferably 0.02 to 1.0, particularly preferably 0.05 to 0.75, most preferably more than 0.10 and not more than 0.75.

If the weight ratio (WB/WC) is not less than 2, the removal rate ratio ($R_{BM}/R_{Cu}$) of the barrier metal film removal rate ($R_{BM}$) to the copper film removal rate ($R_{Cu}$) is liable to become less than 1.2. On the other hand, if the mass ratio (WB/WC) is less than 0.01, the removal rate ratio ($R_{In}/R_{Cu}$) of the insulating film removal rate ($R_{In}$) to the copper film removal rate ($R_{Cu}$) is liable to deviate from the above range of 0.5 to 2, and as a result, there is a fear that a polished surface having excellent surface properties such as flatness is not obtained.

The oxidizing agent to constitute the component (D) is, for example, persulfate, hydrogen peroxide, inorganic acid, organic peroxide or polyvalent metal salt. At least a part of hydrogen peroxide sometimes dissociates in the specific aqueous dispersion to generate a hydrogen peroxide ion, and in the present invention, this hydrogen peroxide ion is also included in the hydrogen peroxide.

Examples of the persulfates include ammonium persulfate and potassium persulfate.

Examples of the inorganic acids include nitric acid and sulfuric acid.

Examples of the organic peroxides include peracetic acid, perbenzoic acid and tert-butyl hydroperoxide.

Examples of the polyvalent metal salts include a permanganic acid compound and a bichromic acid compound. More specifically, the permanganic acid compound is, for example, potassium permanganate, and the bichromic acid compound is, for example, potassium bichromate.

Of the above-mentioned oxidizing agents, preferable are hydrogen peroxide, persulfate and inorganic acid, and particularly preferable is hydrogen peroxide.

The content of the component (D) is in the range of preferably 0.001 to 2% by mass, more preferably 0.01 to 0.75% by mass, particularly preferably 0.05 to 0.5% by mass, based on the whole specific aqueous dispersion. If the content of the component (D) is less than the lower limit of the above range, there is a fear that a satisfactory removal rate is not obtained. On the other hand, if the content of the component (D) exceeds the upper limit of the above range, the polished surface is liable to be corroded.

In the case where hydrogen peroxide is used as the oxidizing agent to constitute the component (D), a polyvalent metal ion having a function of accelerating the action of hydrogen peroxide as the oxidizing agent and a function of enhancing the removal rate can be contained in the specific aqueous dispersion of the invention.

Examples of the polyvalent metal ions include ions of metals such as aluminum, titanium, vanadium, chromium, manganese, iron, cobalt, nickel, copper, zinc, germanium, zirconium, molybdenum, tin, antimony, tantalum, tungsten, lead and cerium. These metal ions can be used singly or in combination of two or more kinds.

These polyvalent metal ions may be formed by adding a salt (e.g., nitrate, sulfate or acetate) containing a polyvalent metal element or a complex containing a polyvalent metal element to an aqueous medium, or may be formed by adding an oxide of a polyvalent metal element to an aqueous medium.

Even a compound which does not form a polyvalent metal ion but forms a monovalent metal ion when added to an aqueous medium can be used as the compound for obtaining the polyvalent metal ion, provided that it can form a polyvalent metal ion thereafter by the action of the oxidizing agent.

Of the compounds for obtaining the polyvalent metal ion, iron nitrate is preferable from the viewpoint that the resulting polyvalent metal ion exhibits an excellent function of enhancing a removal rate.

The content of the polyvalent metal ion is preferably not more than 3,000 ppm, particularly preferably 10 to 2,000 ppm, based on the specific aqueous dispersion.

The specific aqueous dispersion has pH of preferably 8 to 13, more preferably 8.5 to 13, particularly preferably 9 to 12. If pH is less than the lower limit of the above range, etching action of the specific aqueous dispersion against the layer to be processed, such as a copper layer, becomes large, and hence, dishing and erosion are liable to occur. On the other hand, if pH exceeds the upper limit of the above range, there is a fear that the insulating layer is excessively polished, and hence, favorable Damascene copper wiring cannot be formed.

For adjusting pH of the specific aqueous dispersion, a method of controlling the content of the inorganic acid to constitute the component (D), such as nitric acid or sulfuric acid, or the content of the organic acid to constitute the component (B) or the component (C), or a method of adding an alkali component such as sodium hydroxide or ammonia is available.

In the case where an ammonia component composed of ammonia and ammonium ion is contained in the specific aqueous dispersion by using ammonium salt as the component (C) or the component (D), or by adding ammonia as an ammonia component, its concentration is usually not more than 0.005 mol/liter, preferably not more than 0.002 mol/liter, more preferably not more than 0.0005 mol/liter. Particularly preferably, the specific aqueous dispersion does not contain the ammonia component substantially. In other words, it is desired to avoid the use of ammonium salt as the component (D) and the addition of ammonia as the alkali component.

If the specific aqueous dispersion contains the ammonia component in an amount exceeding the upper limit of the above range, the copper film removal rate is relatively large. As a result, properties that the $R_{BM}/R_{cu}$ is not less than 1.2 and the $R_{in}/R_{cu}$ is in the range of 0.5 to 2 is sometimes not actualized, and hence the ammonia component concentration is preferably as low as possible.

The specific aqueous dispersion can be favorably used as a processing liquid in a second polishing step of two-step polishing for forming Damascene copper wiring, namely, a two-step polishing method. In particular, the specific aqueous dispersion of the invention exhibits more excellent polishing properties when it is used in combination with the later-described chemical mechanical polishing aqueous dispersion having properties that when each of a copper film and a barrier metal film is chemically mechanically polished under the same conditions using said dispersion, a removal rate ratio ($R_{Cu}/R_{BM}$) of a copper film removal rate ($R_{Cu}$) to a barrier metal film removal rate ($R_{BM}$) is not less than 50.

In the case where the specific aqueous dispersion of the invention is used as a processing liquid in a one-step polishing method or in the case where the specific aqueous dispersion of the invention is used as a processing liquid in a first polishing step of a two-step polishing method, a long time is required for the polishing step, and a large amount of a processing liquid is necessary, so that such usage sometimes becomes economically disadvantageous.

Chemical Mechanical Polishing Method

The chemical mechanical polishing method according to the invention comprises:

a first polishing step of chemically mechanically polishing a polishing-intended surface by the use of a chemical mechanical polishing aqueous dispersion (also referred to as a "first polishing aqueous dispersion" hereinafter) having polishing properties that when each of a copper film and a barrier metal film are chemically mechanically polished under the same conditions using said dispersion, a removal rate ratio ($R_{Cu}/R_{BM}$) of a copper film removal rate ($R_{Cu}$) to a barrier metal film removal rate ($R_{BM}$) is not less than 50, and a second polishing step of chemically mechanically polishing the polishing-intended surface, which has been chemically mechanically polished in the first polishing step, by the use of the chemical mechanical polishing aqueous dispersion (also referred to as a "specific aqueous dispersion" hereinafter) of the invention.

In the present invention, the first polishing step and the second polishing step may be continuously carried out by using one polishing apparatus and by changing the polishing aqueous dispersion fed while the target to be polished is loaded on the apparatus, or it is also possible that after completion of the first polishing step, the target to be polished is temporarily taken out of the polishing apparatus, then the polishing aqueous dispersion fed is changed, and thereafter the target is loaded on the same polishing apparatus again to perform the second polishing.

The first polishing step and the second polishing step may be carried out by the use of different polishing apparatuses.

When a polishing apparatus equipped with plural polishing pads is used, the first polishing step and the second polishing step may be carried out continuously using different polishing pads.

Next, the chemical mechanical polishing method of the invention is described in detail with reference to the attached drawings, but it should be construed that the invention is in no way limited to the drawings exemplified.

The target to be polished, used in the chemical mechanical polishing method of the invention, is, for example, a composite substrate material 1 having such a structure as shown in FIG. 1(a). The composite substrate material 1 has a substrate 11 comprising silicon or the like; an insulating film 12 which is laminated on a surface of the substrate 11, is provided with a depression for wiring such as a trench and comprises a PETEOS film (film formed by CVD process using tetraethoxysilane) or the like; a barrier metal film 13 which is formed so as to cover the surface of the insulating film 12 and the bottom and the inner wall surface of the depression for wiring and comprises tantalum, tantalum nitride or the like; and a metal film 14 with which the depression for wiring is filled and which is formed on the barrier metal film 13 and comprises a metal wiring material such as copper.

As shown in FIG. 2(a), the target to be polished, used in the chemical mechanical polishing method of the invention, may have an insulating film 21 comprising silicon oxide or the like and insulating film 22 which is formed on the insulating film 21 and comprises silicon nitride or the like, between a substrate 11 and an insulating film 12.

The chemical mechanical polishing method of the invention is a method for polishing the above-described target to be polished in accordance with the following procedure. In the first polishing step, a removal-intended metal material of the metal film 14, which is present on the area other than the metal wiring portion embedded in the depression for wiring, is chemically mechanically polished using the first polishing aqueous dispersion until a prescribed surface, e.g., the barrier metal film 13, is exposed (see FIG. 1(b) and FIG. 2(b)). Thereafter, in the second polishing step, chemical mechanical polishing is carried out using the specific aqueous dispersion so as to completely remove a removal-intended barrier metal portion of the barrier metal film 13, said barrier metal portion being present on the area other than the bottom and the inner wall surface of the depression for wiring. In this polishing step, the surface of the insulting film 12 is also polished at the same time, whereby highly precisely planarized Damascene wiring is obtained (see FIG. 1(c) and FIG. 2(c)).

As previously described, the first polishing aqueous dispersion has polishing properties that a removal rate ratio $(R_{Cu}/R_{BM})$ of a copper film removal rate $(R_{Cu})$ to a barrier metal film removal rate $(R_{BM})$ is not less than 50. This removal rate ratio $(R_{Cu}/R_{BM})$ is preferably not less than 60, more preferably not less than 70. If the removal rate ratio $(R_{Cu}/R_{BM})$ is less than the lower limit of the above range, copper remains excessively in the removal-intended portion of the copper film after the first polishing step, so that a long time is required for the second polishing step, and a large amount of a processing liquid is liable to become necessary.

The first polishing aqueous dispersion is not specifically restricted in its composition, provided that the removal rate ratio $(R_{Cu}/R_{BM})$ is in the above range. The first polishing aqueous dispersion, however, preferably contains abrasive grains, an organic acid, an oxidizing agent and at least one ammonia component selected from the group consisting of ammonia and an ammonium ion in an aqueous medium.

Examples of the aqueous media used for the first polishing aqueous dispersion include those previously exemplified for the aqueous medium in the specific aqueous dispersion of the invention. Of such aqueous media, it is preferable to use water only.

Examples of the abrasive grains used for the first polishing aqueous dispersion include those previously exemplified for the abrasive grains to constitute the component (A) in the specific aqueous dispersion of the invention, and at least one kind of abrasive grains selected from them is employable. Of those abrasive grains, silicon dioxide, organic particles or organic-inorganic composite particles are preferably employed.

Examples of the organic acids used for the first polishing aqueous dispersion include those previously exemplified for the quinolinecarboxylic acid and pyridinecarboxylic acid to constitute the composed (B) and those previously exemplified for the other organic acid to constitute the component (C) in the specific aqueous dispersion of the invention, and at least one organic acid selected from them is employable. Of those organic acids, glycine, alanine, citric acid, malic acid, carboxybenzotriazole, 2-quinolinecarboxylic acid or 2,3-pyridinedicarboxylic acid is preferably employed from the viewpoint that a higher removal rate ratio $(R_{Cu}/R_{BM})$ is obtained.

Examples of the oxidizing agents used for the first polishing aqueous dispersion include those previously exemplified for the oxidizing agent to constitute the component (D) in the specific aqueous dispersion of the invention, and at least one oxidizing agent selected from them is employable. Of those oxidizing agents, hydrogen peroxide or persulfate is preferably employed, and ammonium persulfate is particularly preferably employed.

The ammonia component contained in the first polishing aqueous dispersion may be present as ammonia or an ammonium ion, or ammonia and an ammonium ion may be mingled with each other in the dispersion. The ammonium ion may be present in a free state, or may be present as an ammonium salt of an acid, or both of them may be mingled and coexist at equilibrium. Although such ammonia and ammonium ion may be generated by adding ammonia water independently to the first polishing aqueous dispersion, they may be generated from an ammonium salt of the aforesaid organic acid or an ammonium salt of an inorganic acid added as the oxidizing agent, such as ammonium persulfate, or they may be added as a counter cation of the later-described anionic surface active agent.

The first polishing aqueous dispersion preferably contains the abrasive grains, the organic acid, the oxidizing agent and at least one ammonia component selected from ammonia and an ammonium ion in the following amounts.

The content of the abrasive grains is in the range of usually 0.001 to 3% by mass, preferably 0.01 to 3% by mass, more preferably 0.01 to 2.5% by mass, still more preferably 0.01 to 2% by mass, based on the whole first polishing aqueous dispersion.

The content of the organic acid is in the range of usually 0.01 to 10% by mass, preferably 0.1 to 5% by mass, based on the whole first polishing aqueous dispersion.

The content of the oxidizing agent is in the range of usually 0.01 to 10% by mass, preferably 0.02 to 5% by mass, based on the whole first polishing aqueous dispersion.

The content of the ammonia component is in the range of usually 0.005 to 20 mol, preferably 0.01 to 15 mol, more preferably 0.03 to 10 mol, particularly preferably 0.05 to 10 mol, based on 1 liter of the first polishing aqueous dispersion.

The first polishing aqueous dispersion may be further contain additives, such as a surface active agent, an antifoaming agent and a protective film-forming agent for metal surfaces, when needed.

The surface active agent is, for example, a cationic surface active agent, an anionic surface active agent, an amphoteric surface active agent, a nonionic surface active agent or a water-soluble polymer. In particular, an anionic surface active agent, a nonionic surface active agent or a water-soluble polymer is preferably employed.

Examples of the anionic surface active agents include carboxylates, sulfonates, sulfuric ester salts and phosphoric ester salts. Examples of the carboxylates include fatty acid soap and alkyl ether carboxylate. Examples of the sulfonates include alkylbenzenesulfonate, alkylnaphthalenesulfonate and α-olefin sulfonate. Examples of the sulfuric ester salts include fatty alcohol sulfate, alkyl ether sulfate and polyoxyethylene alkylphenyl ether sulfate. Examples of the phosphoric ester salts include alkyl phosphoric ester salt. Of these, preferable are sulfonates, more preferable is alkylbenzenesulfonate, and particularly preferable is potassium dodecylbenzenesulfonate.

Examples of the nonionic surface active agents include a polyethylene glycol-based surface active agent, acetylene glycol, an ethylene oxide adduct of acetylene glycol, and acetylene alcohol.

Examples of the water-soluble polymers include anionic polymers, cationic polymers, amphoteric polymers and nonionic polymers. Examples of the anionic polymers include polyacrylic acid and salt thereof, polymethacrylic acid and salt thereof, and polyvinyl alcohol. Examples of the cationic polymers include polyethyleneimine and polyvinylpyrrolidone. Examples of the amphoteric polymers include polyacrylamide. Examples of the nonionic polymers include polyethylene oxide and polypropylene oxide.

The content of the surface active agent is preferably not more than 20% by mass, more preferably 0.001 to 20% by mass, still more preferably 0.01 to 10% by mass, particularly preferably 0.05 to 5% by mass, based on the whole first polishing aqueous dispersion.

Examples of the protective film-forming agents for metal surfaces include benzotriazole and derivatives of benzotriazole. The content of the protective film-forming agent is preferably not more than 5% by mass, more preferably 0.001 to 5% by mass, still more preferably 0.005 to 1% by mass, particularly preferably 0.01 to 0.5% by mass, based on the whole first polishing aqueous dispersion.

The pH of the first polishing aqueous dispersion may be set to a value in any of an acidic region, a region in the vicinity of neutrality (from weak acidic region to weak alkaline region) and an alkaline region. pH in the acidic region is preferably 2 to 4; pH in the region in the vicinity of neutrality is preferably 6 to 8; and pH in the alkaline region is preferably 8 to 12. Of these, pH in the region in from the vicinity of neutrality to the alkaline region, namely, 6 to 12, is preferable.

In the chemical mechanical polishing method of the invention, polishing can be carried out using a commercially available chemical mechanical polishing apparatus (e.g., LGP510, LGP552 (both manufactured by Lap Master SFT Co.), EPO-113, EPO-222 (both manufactured by Ebara Corporation), Mirra (manufactured by Applied Materials Co.), AVANTI-472 (manufactured by IPEC Inc.)) under the polishing conditions publicly known.

Preferred polishing conditions are as follows. In both of the first polishing step and the second polishing step, adoptable are a turn table rotating speed of usually 30 to 120 rpm, preferably 40 to 100 rpm, a head rotating speed of usually 30 to 120 rpm, preferably 40 to 100 rpm, a ratio of the turn table rotating speed to the head rotating speed of usually 0.5 to 2, preferably 0.7 to 1.5, a polishing pressure of usually 100 to 500 $g/cm^2$, preferably 200 to 350 $g/cm^2$, and a polishing aqueous dispersion feed rate of usually 50 to 300 ml/min, preferably 100 to 200 ml/min.

The chemical mechanical polishing method is specifically carried out as follows, but the present invention is not limited to the following one. First, the target to be polished is loaded on a chemical mechanical polishing apparatus, and with feeding the aforesaid first polishing aqueous dispersion at the above-mentioned polishing aqueous dispersion feed rate, the removal-intended metal material of the metal film 14 of the target is polished under the above-mentioned polishing conditions until the barrier metal film 13 is exposed (first polishing step). Then, the polishing aqueous dispersion fed is changed from the first polishing aqueous dispersion to the specific aqueous dispersion and polishing is performed under the above-mentioned polishing conditions so as to completely remove the removal-intended portion of the barrier metal film 13 of the target (second polishing step), whereby a highly precisely flat polished surface is obtained. The first polishing step and the second polishing step may be performed using one turn table or different turn tables respectively.

In the present invention, it is preferable that abrasive grains remaining on the chemically mechanically polished surface should be removed after the second polishing step. For removing the abrasive grains, a usual cleaning method is employable. For example, the polished surface is subjected to brush scrub cleaning and then further cleaned with an alkaline cleaning solution (e.g., mixed solution of ammonia:hydrogen peroxide:water=1:1:5 (by mass)), whereby the abrasive grains adhering to the polished surface can be removed.

In case of abrasive grains consisting of organic particles, the organic particles can be removed by treating the polished surface at a high temperature in an oxygen atmosphere to combust the organic particles. More specifically, plasma ashing is carried out by, for example, exposing the polished surface to oxygen plasma or down-flow feeding oxygen radical to the polished surface, whereby the abrasive grains remaining on the polished surface can be easily removed.

For removing metal impurities adsorbed on the polished surface, a cleaning solution, such as a citric acid aqueous solution, a mixed solution of hydrofluoric acid and citric acid, or a mixed solution of hydrofluoric acid and ethylenediaminetetraacetic acid (EDTA), is employable.

Chemical Mechanical Polishing Kit

The chemical mechanical polishing kit of the invention comprises a combination of a chemical mechanical polishing aqueous dispersion (I) which is the above-described first polishing aqueous dispersion and a chemical mechanical polishing aqueous dispersion (II) which is the specific aqueous dispersion of the invention, wherein the aqueous dispersion (I) does not mixed with the aqueous dispersion (II). The chemical mechanical polishing kit is preferably employable.

EXAMPLES

The present invention is further described with reference to the following examples, but it should be construed that the invention is in no way limited to those examples.

<Preparation of Aqueous Dispersion Containing Inorganic Particles>
(1) Preparation of Aqueous Dispersion Containing Fumed Silica Particles Preparation Example 1 for Inorganic Particle Dispersion Using an ultrasonic dispersing machine, 2 kg of fumed silica particles (available from Nippon Aerozil Co. Ltd., trade name: Aerozil #90, average primary particle diameter: 20 nm) was dispersed in 6.7 kg of ion-exchanged water to give a dispersion. The dispersion was filtered through a filter having a pore size of 5 μm to prepare an inorganic particle dispersion (1) containing fumed silica particles as inorganic particles.

The inorganic particles (referred to as "fumed silica 1" hereinafter) to constitute the inorganic particle dispersion (1) had an average secondary particle diameter of 220 nm.

Preparation Example 2 for Inorganic Particle Dispersion

An inorganic particle dispersion (2) containing fumed silica particles as inorganic particles was prepared in the same manner as in Preparation Example 1 for inorganic particle dispersion, except that 2 kg of fumed silica particles (available from Nippon Aerozil Co. Ltd., trade name: Aerozil #200, average primary particle diameter: 7 nm) was used instead of the fumed silica particles (available from Nippon Aerozil Co. Ltd., trade name: Aerozil #90).

The inorganic particles (referred to as "fumed silica 2" hereinafter) to constitute the inorganic particle dispersion (2) had an average secondary particle diameter of 140 nm.

(2) Preparation of Aqueous Dispersion Containing Colloidal Silica Particles

Preparation Example 3 for Inorganic Particle Dispersion

In a flask, 70 parts by mass of ammonia water having a concentration of 25% by mass, 40 parts by mass of ion-exchanged water, 170 parts by mass of ethanol and 20 parts by mass of tetraethoxysilane were placed, and with stirring the contents of the flask at a rotating speed of 180 rpm, the contents were heated to 60° C. Then, stirring was continued for 2 hours with maintaining the temperature at 60° C., followed by cooling. Thus, an alcohol dispersion containing colloidal silica particles was obtained.

Then, with maintaining the temperature of the resulting dispersion at 80° C., an operation of adding ion-exchanged water to remove an alcohol content was repeated several times using an evaporator, whereby the alcohol content in the dispersion was removed to prepare an inorganic particle dispersion (3) in which colloidal silica particles were dispersed as inorganic particles in an aqueous dispersion and which had a solids concentration of 20% by mass.

The inorganic particles (referred to as "colloidal silica 1" hereinafter) to constitute the inorganic particle dispersion (3) had an average primary particle diameter of 25 nm and an average secondary particle diameter of 40 nm.

Preparation Example 4 for Inorganic Particle Dispersion

An inorganic particle dispersion (4) in which colloidal silica particles were dispersed as inorganic particles in an aqueous dispersion and which had a solids concentration of 20% by mass was prepared in the same manner as in Preparation Example 3 for inorganic particle dispersion, except that the amount of ethanol used was changed to 175 parts by mass from 170 parts by mass and the amount of tetraethoxysilane used was changed to 25 parts by mass from 20 parts by mass.

The inorganic particles (referred to as "colloidal silica 2" hereinafter) to constitute the inorganic particle dispersion (4) had an average primary particle diameter of 35 nm and an average secondary particle diameter of 55 nm.

Preparation Example 5 for Inorganic Particle Dispersion

An inorganic particle dispersion (5) in which colloidal silica particles were dispersed as inorganic particles in an aqueous dispersion and which had a solids concentration of 20% by mass was prepared in the same manner as in Preparation Example 3 for inorganic particle dispersion, except that the amount of ethanol used was changed to 190 parts by mass from 170 parts by mass and the amount of tetraethoxysilane used was changed to 35 parts by mass from 20 parts by mass.

The inorganic particles (referred to as "colloidal silica 3" hereinafter) to constitute the inorganic particle dispersion (5) had an average primary particle diameter of 50 nm and an average secondary particle diameter of 75 nm.

<Preparation of Aqueous Dispersion Containing Composite Particles>
(1) Preparation of Aqueous Dispersion Containing Inorganic-Organic Composite Particles Preparation Example 1 for Inorganic-organic Composite Particle Dispersion (Preparation of Organic Particle Dispersion)

In a flask, 90 parts by mass of methyl methacrylate, 5 parts by mass of methoxypolyethylene glycol methacrylate (available from Shin-nakamura Chemical Co., Ltd., trade name: NK Ester M-90G, #400), 5 parts by mass of 4-vinylpyridine, 2 parts by mass of an azo type polymerization initiator (available from Wako Pure Chemical Industries, Ltd., trade name: V50) and 400 parts by mass of ion-exchanged water were placed, and with stirring the contents of the flask in a nitrogen gas atmosphere, the contents were heated to 70° C. At this temperature, polymerization was carried out over a period of 6 hours to give an aqueous dispersion containing polymethyl methacrylate-based particles having a cation of amino group and a functional group with polyethylene glycol chain and having an average particle diameter of 150 nm. The polymerization yield was 95%.

The resulting aqueous dispersion was diluted with water to adjust the content of the polymethyl methacrylate-based polymers to 10% by mass, and then 100 parts by mass of this aqueous dispersion were placed in a flask. To the aqueous dispersion, 1 part by mass of methyltrimethoxysilane was added, following by stirring at 40° C. for 2 hours. Thereafter, nitric acid was added to adjust pH of the dispersion to 2, whereby an organic particle dispersion (1) was obtained.

The polymethyl methacrylate-based particles contained as organic particles in the organic particle dispersion (1) had a zeta-potential of +17 mV.

(Preparation of Inorganic Particle Dispersion)

Colloidal silica particles (available from Nissan Chemical Industries, Ltd., trade name: Snowtex O, average primary particle diameter: 12 nm) were dispersed in water, and to the dispersion, a potassium hydroxide aqueous solution was added to adjust pH of the dispersion. Thus, an inorganic particle dispersion (6) containing 10% by mass of colloidal silica particles as inorganic particles and having pH of 8 was obtained.

The colloidal silica particles contained in the inorganic particle dispersion (6) had a zeta-potential of −40 mV.
(Preparation of Inorganic-organic Composite Particle Dispersion)

To 100 parts by mass of the organic particle dispersion (1), 50 parts by mass of the inorganic particle dispersion (6) were slowly added over a period of 2 hours with stirring, and they were further stirred for 2 hours to give an aqueous dispersion containing particles wherein silica particles had adhered onto the polymethyl methacrylate-based particles.

Then, to the resulting aqueous dispersion, 2 parts by mass of vinyltriethoxysilane were added, and they were stirred for 1 hour. Then, 1 part by mass of tetraethoxysilane was further added. The dispersion was heated to 60° C., continuously stirred for 3 hours and then cooled to give an inorganic-organic composite particle dispersion (1) containing 10% by mass of inorganic-organic composite particles having an average particle diameter of 180 nm.

In the inorganic-organic composite particles to constitute the inorganic-organic composite particle dispersion (1), silica particles had adhered onto 80% of the surfaces of the polymethyl methacrylate-based particles.

<Preparation of Polishing Aqueous Dispersion Used for First Polishing Step>

Preparation Example 1 for First Polishing Aqueous Dispersion

Using an ultrasonic dispersing machine, 2 kg of fumed silica particles (available from Nippon Aerozil Co. Ltd., trade name: Aerozil #90, average primary particle diameter: 20 nm, average secondary particle diameter: 220 nm) was dispersed in 6.7 kg of ion-exchanged water to give a dispersion. The dispersion was filtered through a filter having a pore size of 5 μm to prepare an aqueous dispersion containing fumed silica particles.

Then, into a polyethylene bottle, the aqueous dispersion containing fumed silica particles in amounts corresponding to 1.2% by mass in terms of mass of silica was introduced, and to the dispersion, quinaldinic acid in an amount corresponding to 0.5% by mass, Surfinol 465 (trade name, nonionic surface active agent having triple bond, available from Air Products Japan Co. Ltd.) in an amount corresponding to 0.05% by mass and ammonium persulfate in an amount corresponding to 1.0% by mass were added. The resulting dispersion was diluted with ion-exchanged water and then sufficiently stirred. After pH of the dispersion was adjusted to 9.5 by the use of a potassium hydroxide aqueous solution, the dispersion was filtered through a filter having a pore size of 5 μm to prepare a first polishing aqueous dispersion.

[Polishing Performance Test of First Polishing Aqueous Dispersion]

On a chemical mechanical polishing apparatus (manufactured by Ebara Corporation, model: EPO112), each of the following substrates for polishing performance test, which had processed films for the measurement of removal rates, was loaded. With feeding the first polishing aqueous dispersion, polishing was carried out for 1 minute under the following polishing conditions using a porous polyurethane polishing pad (available from Rodel Nitta Company, product number: IC1000), and the removal rate was calculated in the following manner.

(Substrates for Polishing Performance Test)

8-inch silicon substrate with thermal oxidation film having thereon copper film of 15,000 Å thick 8-inch silicon substrate with thermal oxidation film having thereon tantalum film of 2,000 Å thick 8-inch silicon substrate with thermal oxidation film having thereon tantalum nitride film of 2,000 Å thick (Polishing Conditions)

Head rotating speed: 70 rpm
Head load: 250 g/cm$^2$
Table rotating speed: 70 rpm
Feed rate of chemical mechanical polishing aqueous dispersion: 200 ml/min (Calculation of Polishing Rate)

The film thickness after polishing was measured using an electricity conduction type film thickness measuring machine (manufactured by KLA Tencor Co., model: Omni-Map RS75), and from the film thickness decreased by polishing and the polishing time, a removal rate was calculated.

(Results of Removal Rate Calculation)

Copper film removal rate ($R_{Cu}$): 5200 Å/min
Tantalum film removal rate ($R_{BM}$): 30 Å/min
Tantalum nitride film removal rate ($R_{BM}$): 40 Å/min
Copper film removal rate/tantalum film removal rate ($R_{Cu}/R_{BM}$): 173
Copper film removal rate/tantalum nitride film removal rate ($R_{Cu}/R_{BM}$): 130

<Preparation of Target to be Polished, Used in Two-Step Polishing>

Preparation Example 1 for Target Substrate to be Polished

On a surface of a substrate made of silicon, a PETEOS film (insulating film) was laminated, and then on the surface of the film, a pattern with a trench having a depth of 1 μm and a width of 100 μm was formed by lithography. Then, on a surface of the insulating film, a barrier metal film consisting of a tantalum film of 300 Å thick was formed by sputtering. Thereafter, in order to fill copper in the trench whose bottom and inner wall surface had been covered with the tantalum film, a copper film having a thickness of 1.3 μm (13000 Å) was deposited by sputtering and plating. Thus, a target substrate (1) to be polished, wherein a PETEOS film, a tantalum film and a copper film had been laminated in this order on a substrate surface and the trench had been filled with copper, was prepared.

Preparation Example 2 for Target Substrate to be Polished

A target substrate (2) to be polished, wherein a PETEOS film, a tantalum nitride film and a copper film had been laminated in this order on a substrate surface and the trench had been filled with copper, was prepared in the same manner as in Preparation Example 1 for target substrate to be polished, except that a tantalum nitride film was formed instead of the tantalum film.

Example 1

<Preparation of Specific Aqueous Dispersion Used for Second Polishing Step>

Preparation Example 1 for Specific Aqueous Dispersion

Into a polyethylene bottle, the inorganic particle dispersion (3) in an amount corresponding to 5 parts by mass in terms of solids was introduced, and to the dispersion, 0.3 part by mass of maleic acid, 0.5 part by mass of quinaldinic acid and 0.3 part by mass of hydrogen peroxide were successively added, followed by stirring for 15 minutes. Then, pH of the dispersion was adjusted to 10.5 by the use of potassium hydroxide, and ion-exchanged water was added in such an amount that the total amount of all the constituents became 100 parts by weight. Thereafter, the dispersion was filtered through a filter having a pore size of 5 μm to give a specific aqueous dispersion (1) having pH of 10.5.

[Polishing Performance Test of Specific Aqueous Dispersion (1)]

On a chemical mechanical polishing apparatus (manufactured by Ebara Corporation, model: EPO112), each of the following substrates for polishing performance test, which had processed films for the measurement of removal rates, was loaded. With feeding the specific aqueous dispersion (1), polishing was carried out for 1 minute under the following polishing conditions using a porous polyurethane polishing pad (available from Rodel Nitta Company, product number: IC1000), and the removal rate was calculated in the following manner. The results are set forth in Table 1.

(Substrates for Polishing Performance Test)

8-inch silicon substrate with thermal oxidation film having thereon copper film of 15,000 Å thick 8-inch silicon substrate with thermal oxidation film having thereon tantalum film of 2,000 Å thick 8-inch silicon substrate with thermal oxidation film having thereon tantalum nitride film of 2,000 Å thick 8-inch silicon substrate with PETEOS film (film thickness: 10,000 Å)

(Polishing Conditions)

Head rotating speed: 70 rpm

Head load: 250 g/cm$^2$

Table rotating speed: 70 rpm

Feed rate of chemical mechanical polishing aqueous dispersion: 200 ml/min (Calculation of Polishing Rate)

With respect to the copper film, the tantalum film and the tantalum nitride film, the film thickness after polishing was measured using an electricity conduction type film thickness measuring machine (manufactured by KLA Tencor Co., model: OmniMap RS75), and from the film thickness decreased by polishing and the polishing time, a removal rate was calculated.

With respect to the PETEOS film, the film thickness after polishing was measured using a light interference type film thickness measuring machine (manufactured by SENTEC Ltd., model: FPT500), and from the film thickness decreased by polishing and the polishing time, a removal rate was calculated.

[Chemical Mechanical Polishing of Target Substrate to be Polished]

(1) First Polishing Step

On a chemical mechanical polishing apparatus (manufactured by Ebara Corporation, model: EPO112), each of the target substrate (1) and the target substrate (2) was loaded. With feeding the first polishing aqueous dispersion, polishing was carried out on the polishing-intended surface for 3.25 minutes under the following polishing conditions using a porous polyurethane polishing pad (available from Rodel Nitta Company, product number: IC1000).

After completion of the first polishing step, a size of dishing formed on the copper wiring portion having a width of 100 μm of the polished surface was measured by a surface roughness meter (manufactured by KLA Tencor Co., model: P-10), and as a result, it was 500 Å. The term "size of dishing" used herein means a distance (difference in height) between the plane formed by the insulating film or the barrier metal film on the substrate surface and the lowest point of the copper wiring portion.

Further, 200 unit-regions (unit region: 120 μm×120 μm) in the copper wiring portion were observed at random by a light microscope in a dark field, and the number of unit regions where a scratch had occurred was counted as the number of scratches. As a result, the number of scratches was 0.

(Polishing Conditions)

Head rotating speed: 70 rpm

Head load: 250 g/cm$^2$

Table rotating speed: 70 rpm

Feed rate of chemical mechanical polishing aqueous dispersion: 200 ml/min

The polishing time in the first polishing step was calculated by the following formula.

Polishing time (min)=$T_1/R_{Cu}$×1.3

In the above formula, $T_1$ is a thickness of a copper layer and $R_{Cu}$ is a copper film removal rate. In this example, $T_1$=13000 Å and $R_{Cu}$=5200 Å/min.

(2) Second Polishing Step

After completion of the first polishing step, the processing liquid to be fed was changed to the specific aqueous dispersion (1) from the first polishing aqueous dispersion, and continuously from the first polishing step, polishing was carried out for a polishing time calculated by the following formula.

Polishing time (min)=$T_2/R_{BM}+(D-T_2)/R_{In}$

In the above formula, $T_2$ is a thickness of a barrier metal layer, $R_{BM}$ is a barrier metal film removal rate, D is a size of dishing formed on the copper wiring portion having a width of 100 μm of the surface polished in the first polishing step, and $R_{In}$ is an insulating film removal rate. In this example, $T_2$=300 Å and D=500 Å.

After completion of the second polishing step, a size of dishing formed on the copper wiring portion having a width of 100 μm of the polished surface of each of the target substrate (1) and the target substrate (2) was measured by a surface roughness meter (manufactured by KLA Tencor Co., model: P-10).

Further, 200 unit-regions (unit region: 120 μm×120 μm) in the copper wiring portion were observed at random by a light microscope in a dark field, and the number of unit regions where a scratch had occurred was counted as the number of scratches.

The results are set forth in Table 1.

Examples 2 to 8, and Comparative Example 1

Specific aqueous dispersions (2) to (8) and (c1) were prepared in the same manner as in Preparation Example 1 for specific aqueous dispersion (1) in Example 1, except that the components (A) to (D) were changed to those shown in Table 1 and Table 2. pH values of the resulting specific aqueous dispersions (2) to (8) and (c1) are set forth in Table 1 and Table 2.

Using each of the specific aqueous dispersions (2) to (8) and (c1), polishing performance test and chemical mechanical polishing of the target substrates were carried out in the same manner as in Example 1. The results are set forth in Table 1 and Table 2.

TABLE 1

|  |  |  | Ex. 1 | Ex. 2 | Ex. 3 | Ex. 4 | Ex. 5 |
|---|---|---|---|---|---|---|---|
| Specific aqueous dispersion | | | 1 | 2 | 3 | 4 | 5 |
| Composition | Component A | Colloidal silica particles type | colloidal silica 1 | colloidal silica 1 | colloidal silica 3 | colloidal silica 1 | colloidal silica 2 |
| | | % by mass | 5 | 5 | 3 | 8 | 3.5 |
| | | Fumed silica particles type | — | — | — | — | — |
| | | % by mass | — | — | — | — | — |
| | | Composite particles % by mass | — | — | — | — | — |
| | Component B | type | quinaldinic acid | quinaldinic acid | quinaldinic acid | quinaldinic acid | quinolinic acid |
| | | % by mass | 0.5 | 0.2 | 0.1 | 0.2 | 0.1 |
| | Component C | type | maleic acid | maleic acid | maleic acid | citric acid | maleic acid |
| | | % by mass | 0.3 | 0.6 | 1.0 | 0.3 | 1.0 |
| | Component D | type | hydrogen peroxide | hydrogen peroxide | hydrogen peroxide | hydrogen peroxide | hydrogen peroxide |
| | | % by mass | 0.3 | 0.3 | 0.3 | 0.3 | 0.1 |
| | WB/WC | | 1.67 | 0.33 | 0.10 | 0.67 | 0.10 |
| | pH | | 10.5 | 10.5 | 9.5 | 11.5 | 10.5 |
| Polishing properties | $R_{Cu}$ (Å/min) | | 420 | 350 | 380 | 420 | 410 |
| | $R_{BM}$ (tantalum) (Å/min) | | 550 | 680 | 630 | 710 | 590 |
| | $R_{BM}$ (tantalum nitride) (Å/min) | | 920 | 1100 | 990 | 1250 | 1000 |
| | $R_{In}$ (PETEOS) (Å/min) | | 380 | 350 | 330 | 510 | 360 |
| | $R_{BM}$ (tantalum)/$R_{Cu}$ | | 1.31 | 1.94 | 1.66 | 1.69 | 1.44 |
| | $R_{BM}$ (tantalum nitride)/$R_{Cu}$ | | 2.19 | 3.14 | 2.61 | 2.98 | 2.44 |
| | $R_{In}$ (PETEOS)/$R_{Cu}$ | | 0.90 | 1.00 | 0.87 | 1.21 | 0.88 |
| Evaluation | Target substrate (1) (BM film = tantalum film) | Polishing time (min) | 1.07 | 1.01 | 1.08 | 0.81 | 1.06 |
| | | Dishing(Å) | 230 | 210 | 240 | 310 | 250 |
| | | Number of scratches | 0 | 0 | 2 | 0 | 1 |
| | Target substrate (2) (BM film = tantalum nitride film) | Polishing time (min) | 0.85 | 0.84 | 0.91 | 0.63 | 0.86 |
| | | Dishing(Å) | 190 | 180 | 200 | 290 | 220 |
| | | Number of scratches | 0 | 0 | 2 | 0 | 1 |

TABLE 2

|  |  |  | Ex. 6 | Ex. 7 | Ex. 8 | Comp. Ex. 1 |
|---|---|---|---|---|---|---|
| Specific aqueous dispersion | | | 6 | 7 | 8 | 9 |
| Composition | Component A | Colloidal silica particles type | colloidal silica 3 | colloidal silica 1 | colloidal silica 3 | — |
| | | % by mass | 2 | 2 | 4 | — |
| | | Fumed silica particles type | fumed silica 2 | fumed silica 1 | — | fumed silica 1 |
| | | % by mass | 2 | 1 | — | 1 |
| | | Composite particles % by mass | — | 2 | — | — |
| | Component B | type | quinaldinic acid | quinolinic acid | quinaldinic acid | quinaldinic acid |
| | | % by mass | 0.2 | 0.4 | 0.3 | 0.5 |
| | Component C | type | maleic acid | maleic acid | malic acid | oxalic acid |
| | | % by mass | 0.6 | 0.4 | 0.3 | 0.2 |
| | Component D | type | hydrogen peroxide | hydrogen peroxide | hydrogen peroxide | ammonium persulfate |
| | | % by mass | 1.5 | 1.0 | 0.5 | 1.0 |
| | WB/WC | | 0.33 | 1.0 | 1.0 | 2.5 |
| | pH | | 10.5 | 10.5 | 10.0 | 9.0 |
| Polishing properties | $R_{Cu}$ (Å/min) | | 280 | 340 | 420 | 6900 |
| | $R_{BM}$ (tantalum) (Å/min) | | 610 | 690 | 550 | 80 |
| | $R_{BM}$ (tantalum nitride) (Å/min) | | 950 | 1150 | 850 | 130 |
| | $R_{In}$ (PETEOS) (Å/min) | | 410 | 320 | 350 | 150 |
| | $R_{BM}$ (tantalum)/$R_{Cu}$ | | 2.18 | 2.03 | 1.31 | 0.01 |
| | $R_{BM}$ (tantalum nitride)/$R_{Cu}$ | | 3.39 | 3.38 | 2.02 | 0.02 |
| | $R_{In}$ (PETEOS)/$R_{Cu}$ | | 1.46 | 0.94 | 0.83 | 0.02 |
| Evaluation | Target substrate (1) (BM film = tantalum film) | Polishing time (min) | 0.98 | 1.06 | 1.12 | 5.08 |
| | | Dishing(Å) | 170 | 230 | 490 | 850 |
| | | Number of scratches | 2 | 0 | 0 | 1 |
| | Target substrate (2) (BM film = tantalum nitride film) | Polishing time (min) | 0.80 | 0.89 | 0.92 | 3.64 |
| | | Dishing(Å) | 160 | 210 | 470 | 820 |
| | | Number of scratches | 3 | 0 | 0 | 1 |

INDUSTRIAL APPLICABILITY

The present invention is applied to a process for producing semiconductor devices, and as a result, semiconductor devices having excellent Damascene copper wiring can be provided.

What is claimed is:

1. A chemical mechanical polishing aqueous dispersion comprising a component (A) composed of abrasive grains, a component (B) composed of at least one of quinolinecarboxylic acid and pyridinecarboxylic acid, a component (C) composed of an organic acid other than quinolinecarboxylic acid and pyridinecarboxylic acid and a component (D) composed of an oxidizing agent, wherein:

a mass ratio (WB/WC) of the content (WB) of the component (B) to the content (WC) of the component (C) is not less than 0.01 and less than 2, and a concentration of an ammonia component composed of ammonia and ammonium ion is not more than 0.005 mol/liter.

2. The chemical mechanical polishing aqueous dispersion as claimed in claim 1, which has properties that when each of a copper film, a barrier metal film and an insulating film is chemically mechanically polished under the same conditions using said dispersion, a removal rate ratio ($R_{BM}/R_{Cu}$) of a barrier metal film removal rate ($R_{BM}$) to a copper film removal rate ($R_{Cu}$) is not less than 1.2, and a removal rate ratio ($R_{In}/R_{Cu}$) of an insulating film removal rate ($R_{In}$) to a copper film removal rate ($R_{Cu}$) is 0.5 to 2.

3. The chemical mechanical polishing aqueous dispersion as claimed in claim 1, wherein the organic acid to constitute the component (C) comprises an organic acid of 4 or more carbon atoms.

4. The chemical mechanical polishing aqueous dispersion as claimed in claim 1, wherein the oxidizing agent to constitute the component (D) comprises hydrogen peroxide.

5. The chemical mechanical polishing aqueous dispersion as claimed in claim 1, which has pH of 8 to 13.

6. A chemical mechanical polishing method for chemically mechanically polishing a target to be polished, through two-step polishing, wherein said target has at least an insulating film with a trench, a barrier metal film and a copper film laminated in this order on a surface of a substrate, said method comprising:

a first polishing step of chemically mechanically polishing a removal-intended portion of the copper film of the target to be polished to remove said portion until the barrier metal film is exposed, by the use of a chemical mechanical polishing aqueous dispersion having properties that when each of a copper film and a barrier metal film is chemically mechanically polished under the same conditions using said dispersion, a removal rate ratio ($R_{Cu}/R_{BM}$) of a copper film removal rate ($R_{Cu}$) to a barrier metal film removal rate ($R_{BM}$) is not less than 50, and a second polishing step of chemically mechanically polishing a polishing-intended surface, which has been chemically mechanically polished in the first polishing step, to remove a removal-intended portion of the barrier metal film of the target to be polished, by the use of a chemical mechanical polishing aqueous dispersion having properties that when each of a copper film, a barrier metal film and an insulating film is chemically mechanically polished under the same conditions using said dispersion, a removal rate ratio ($R_{BM}/R_{Cu}$) of a barrier metal film removal rate ($R_{BM}$) to a copper film removal rate ($R_{Cu}$) is not less than 1.2, and a removal rate ratio ($R_{In}/R_{Cu}$) of an insulating film removal rate ($R_{In}$) to a copper film removal rate ($R_{Cu}$) is 0.5 to 2;

wherein the aqueous dispersion used in the second polishing step comprises a component (A) composed of abrasive grains, a component (B) composed of at least one of quinolinecarboxylic acid and pyridinecarboxylic acid, a component (C) composed of an organic acid other than quinolinecarboxylic acid and pyridinecarboxylic acid and a component (D) composed of an oxidizing agent, and a mass ratio (WB/WC) of the content (WB) of the component (B) to the content (WC) of the component (C) is not less than 0.01 and less than 2.

7. The chemical mechanical polishing method as claimed in claim 6, wherein the concentration of an ammonia component composed of ammonia and ammonium ion in the chemical mechanical polishing aqueous dispersion used in the second polishing step is not more than 0.005 mol/liter.

8. The chemical mechanical polishing method as claimed in claim 6, wherein the organic acid to constitute the component (C) comprises an organic acid of 4 or more carbon atoms.

9. The chemical mechanical polishing method as claimed in claim 6, wherein the concentration of the oxidizing agent to constitute the component (D) contained in the chemical mechanical polishing aqueous dispersion used in the second polishing step is 0.001 to 2% by mass.

10. The chemical mechanical polishing method as claimed in claim 6, wherein the oxidizing agent to constitute the component (D) comprises hydrogen peroxide.

11. The chemical mechanical polishing method as claimed in claim 6, wherein the chemical mechanical polishing aqueous dispersion used in the second polishing step contains the abrasive grains to constitute the component (A) in an amount of more than 1 part by mass and not more than 10 parts by mass based on 100 parts by mass of the aqueous dispersion.

12. The chemical mechanical polishing method as claimed in claim 6, wherein the chemical mechanical polishing aqueous dispersion used in the first polishing step comprises abrasive grains, an organic acid and an oxidizing agent, said aqueous dispersion containing at least one ammonia component selected from the group consisting of ammonia and an ammonium ion.

13. The chemical mechanical polishing method as claimed in claim 12, wherein the oxidizing agent contained in the chemical mechanical polishing aqueous dispersion used in the first polishing step comprises ammonium persulfate.

14. A chemical mechanical polishing kit comprising a combination of chemical mechanical polishing aqueous dispersion (I) and (II), wherein the aqueous dispersion (I) does not mixed with the aqueous dispersion (II);

the aqueous dispersion (I) comprises abrasive grains, an organic acid and an oxidizing agent, said aqueous dispersion (I) comprising at least one ammonia component selected from the group consisting of ammonia and an ammonium ion, and has properties that when each of a copper film and a barrier metal film is chemically mechanically polished under the same conditions using said dispersion, a removal rate ratio ($R_{Cu}/R_{BM}$) of a copper film removal rate ($R_{Cu}$) to a barrier metal film removal rate ($R_{BM}$) is not less than 50; and the aqueous dispersion (II) comprises a component (A) composed of abrasive grains, a component (B) composed of at least one of quinolinecarboxylic acid and pyridinecarboxylic acid, a component (C) composed of an organic acid other than quinolinecarboxylic acid and pyridinecarboxylic acid and a component (D) composed of an oxidizing agent, a mass ratio (WB/WC) of the content (WB) of said component (B) to the content (WC) of said component (C) being not less than 0.01 and less than 2, and has properties that when each of a copper film, a barrier metal film and an insulating film is chemically mechanically polished under the same conditions using said dispersion, a removal rate ratio ($R_{BM}/R_{Cu}$) of a barrier metal film removal rate ($R_{BM}$) to a copper film removal rate ($R_{Cu}$) is not less than 1.2, and a removal rate ratio ($R_{In}/R_{Cu}$) of an insulating film removal rate ($R_{In}$) to a copper film removal rate ($R_{Cu}$) is 0.5 to 2.

15. The chemical mechanical polishing kit as claimed in claim 14, wherein the concentration of an ammonia component composed of ammonia and ammonium ion in the chemical mechanical polishing aqueous dispersion (II) is not more than 0.005 mol/liter.

16. The chemical mechanical polishing kit as claimed in claim 14, wherein the organic acid to constitute the component (C) comprises an organic acid of 4 or more carbon atoms.

17. The chemical mechanical polishing kit as claimed in claim 14, wherein the concentration of the oxidizing agent to constitute the component (D) contained in the chemical mechanical polishing aqueous dispersion (II) is 0.001 to 2% by mass.

18. The chemical mechanical polishing kit as claimed in claim 14, wherein the oxidizing agent to constitute the component (D) comprises hydrogen peroxide.

19. The chemical mechanical polishing kit as claimed in claim 14, wherein the chemical mechanical polishing aqueous dispersion (II) contains the abrasive grains to constitute the component (A) in an amount of more than 1 part by mass and not more than 10 parts by mass based on 100 parts by mass of the aqueous dispersion (II).

20. The chemical mechanical polishing kit as claimed in claim 14, wherein the oxidizing agent contained in the chemical mechanical polishing aqueous dispersion (I) comprises ammonium persulfate.

* * * * *